US012626732B2

(12) United States Patent
Lu et al.

(10) Patent No.: US 12,626,732 B2
(45) Date of Patent: May 12, 2026

(54) SEMICONDUCTOR STRUCTURE INCLUDING MEMORY SIGNAL TRANSMISSION LINE IN BACKSIDE REDISTRIBUTION

(71) Applicant: TAIWAN SEMICONDUCTOR MANUFACTURING COMPANY LTD., Hsinchu (TW)

(72) Inventors: Ze-Xian Lu, Hsinchu (TW); Po-Hsun Chu, Tainan (TW); Bo Wei Wu, New Taipei (TW); Jung-Hsuan Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 186 days.

(21) Appl. No.: 18/588,008

(22) Filed: Feb. 27, 2024

(65) Prior Publication Data

US 2025/0273249 A1     Aug. 28, 2025

(51) Int. Cl.
*G11C 5/06* (2006.01)
*H10B 10/00* (2023.01)
(52) U.S. Cl.
CPC ........... *G11C 5/063* (2013.01); *H10B 10/125* (2023.02)

(58) Field of Classification Search
CPC .............................. G11C 5/063; H10B 10/125
USPC ........................................................... 365/63
See application file for complete search history.

(56) References Cited

U.S. PATENT DOCUMENTS

2024/0312493 A1* 9/2024 Park ....................... H10B 10/12
2024/0365528 A1* 10/2024 Sung .................. H10D 30/6211

* cited by examiner

*Primary Examiner* — Fernando Hidalgo
(74) *Attorney, Agent, or Firm* — WPAT LAW; Anthony King

(57) ABSTRACT

A semiconductor structure includes a substrate, a data storage element, and first and second bit line sets. The substrate has a front side and a backside and includes a substrate layer, a first active layer, and a second active layer. The second active layer is proximal to the front side. The substrate layer is proximal to the backside. The data storage element extends across the first and second active layers. The first bit line set includes a first bit line and a first complementary bit line. At least one of the first bit line and the first complementary bit line is disposed on the front side of the substrate. The second bit line set includes a second bit line and a second complementary bit line. At least one of the second bit line and the second complementary bit line is disposed on the backside of the substrate.

20 Claims, 16 Drawing Sheets

601

105a ⎱
105b ⎰ 105
105c
105d 104a
104b ⎰ 104
104c
104d 103a
103b ⎰ 103
103c
103d

101 ⎱ 10
105 ⎰

B'

T3

106a

104b

105a

106b

103b

101

103a

111    T1

104d

104c

104a

103c

105b

T4

T2

B

106a ⎫
106b ⎬ 106

105a ⎫
105b ⎬ 105

104a ⎫
104b ⎬ 104
104c ⎪
104d ⎭

103a ⎫
103b ⎬ 103
103c ⎪
103d ⎭

101 ⎫
105 ⎬ 10
106 ⎭

605

226

225

222

223

323

322

BM0

20

M0 { 222 223
M2 { 225 226

607
101
111
40
331(BM1)
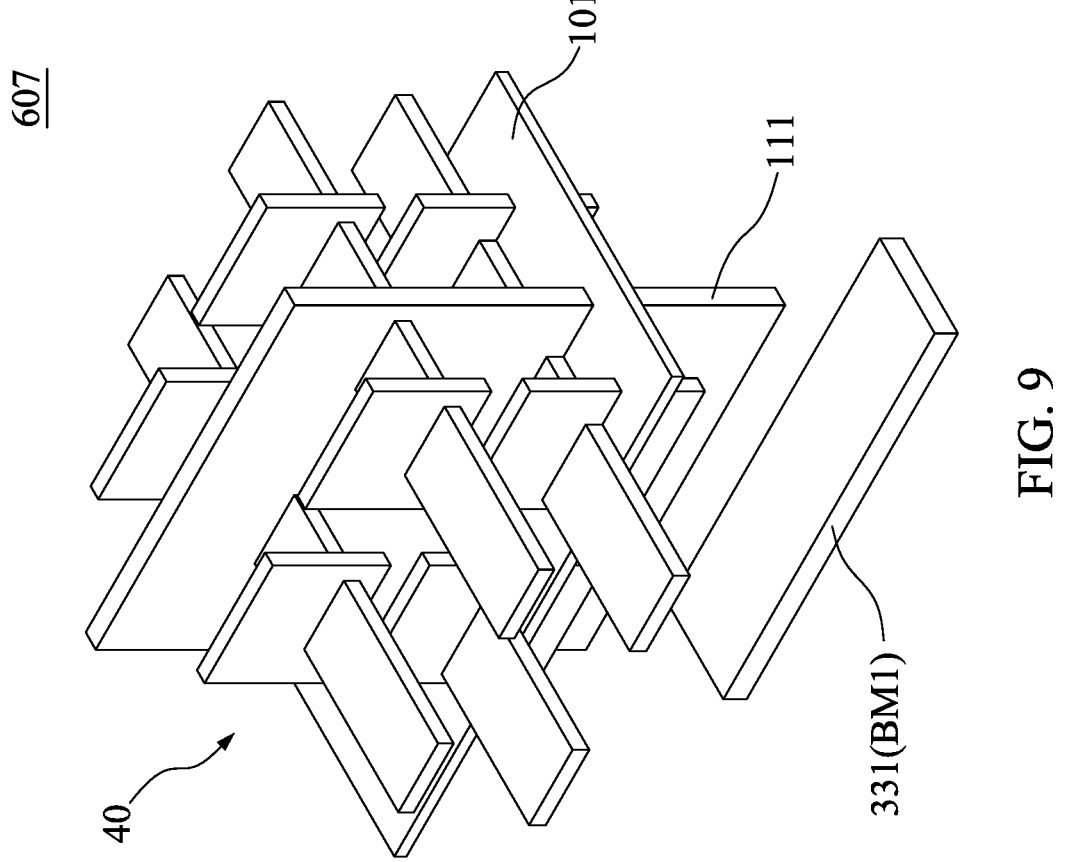
FIG. 9
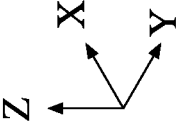

608
231(M1)
331(BM1)
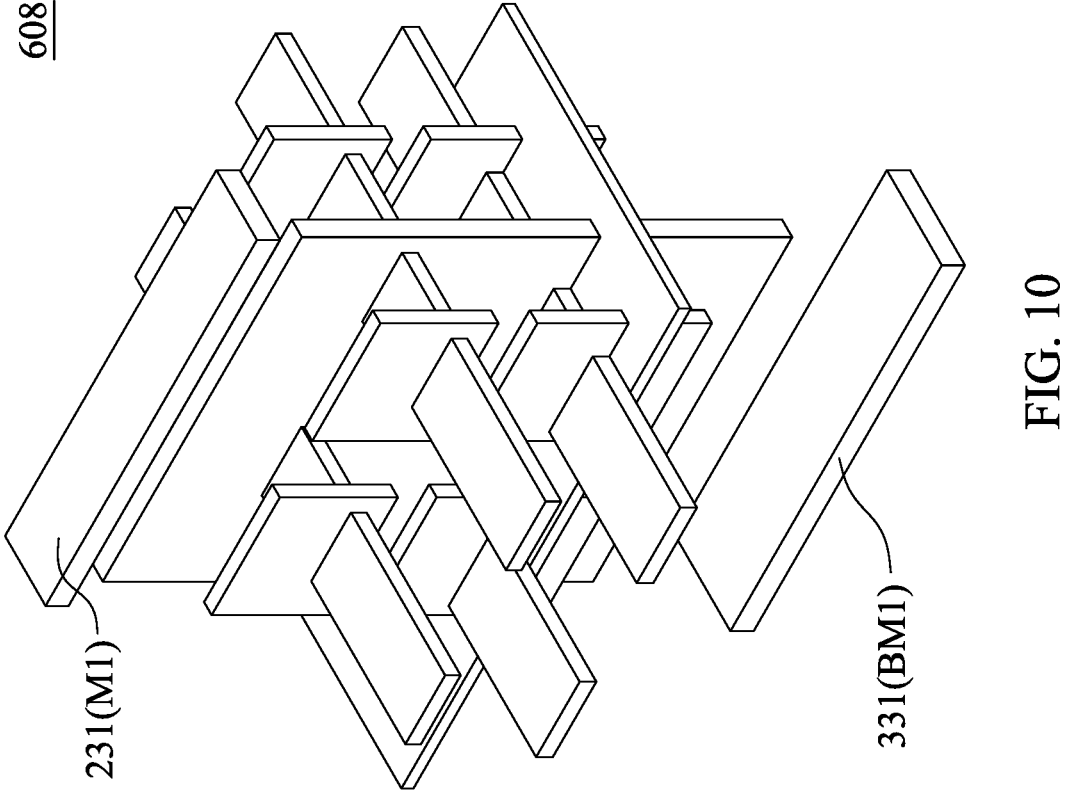
FIG. 10
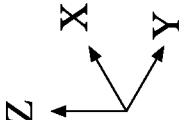
Z
X
Y 609
251(M3)
231(M1)
331(BM1)
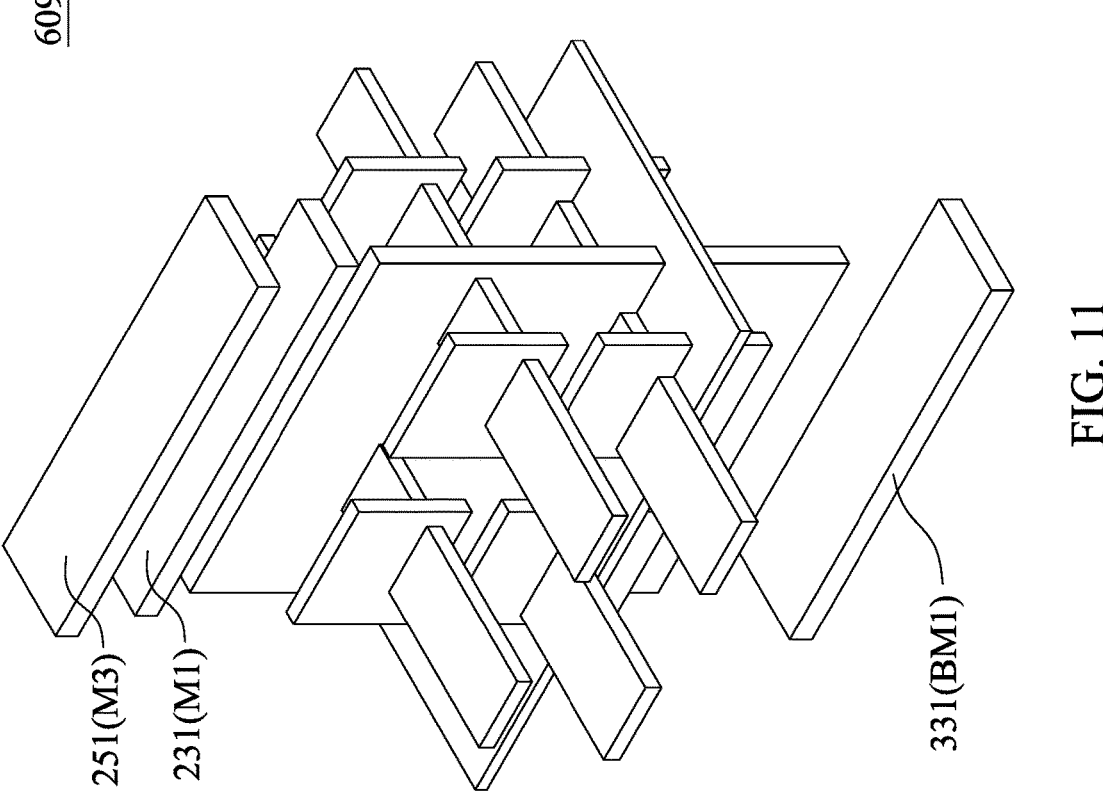
FIG. 11
M1
M3 } 20
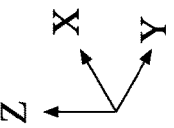

610

M0 223 222

331(BM1)

323 322

BM0

611

M0
223
222

231(M1)

331(BM1)

323
322
BM0

612

SEMICONDUCTOR STRUCTURE INCLUDING MEMORY SIGNAL TRANSMISSION LINE IN BACKSIDE REDISTRIBUTION

BACKGROUND

The semiconductor integrated circuit industry has experienced rapid growth in recent years. Technological advances in semiconductor materials and design have produced increasingly compact and complex circuits. Such material and design advances have been made possible as technologies related to processing and manufacturing have also undergone technical advances. As the semiconductor industry has progressed into advanced technology process nodes in pursuit of smaller product scales and multiple functions, various approaches have been studied and obstacles of electrical resistance and coupling effect of signals of a memory device have been encountered.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, dimensions of the various features may be arbitrarily increased or reduced for clarity of discussion.

FIGS. 5 to 13 are schematic 3D diagrams of semiconductor structures for illustrations of different arrangements of signal lines in order to achieve a data storage device in accordance with different embodiments of the present disclosure.

DETAILED DESCRIPTION

Figure 1:
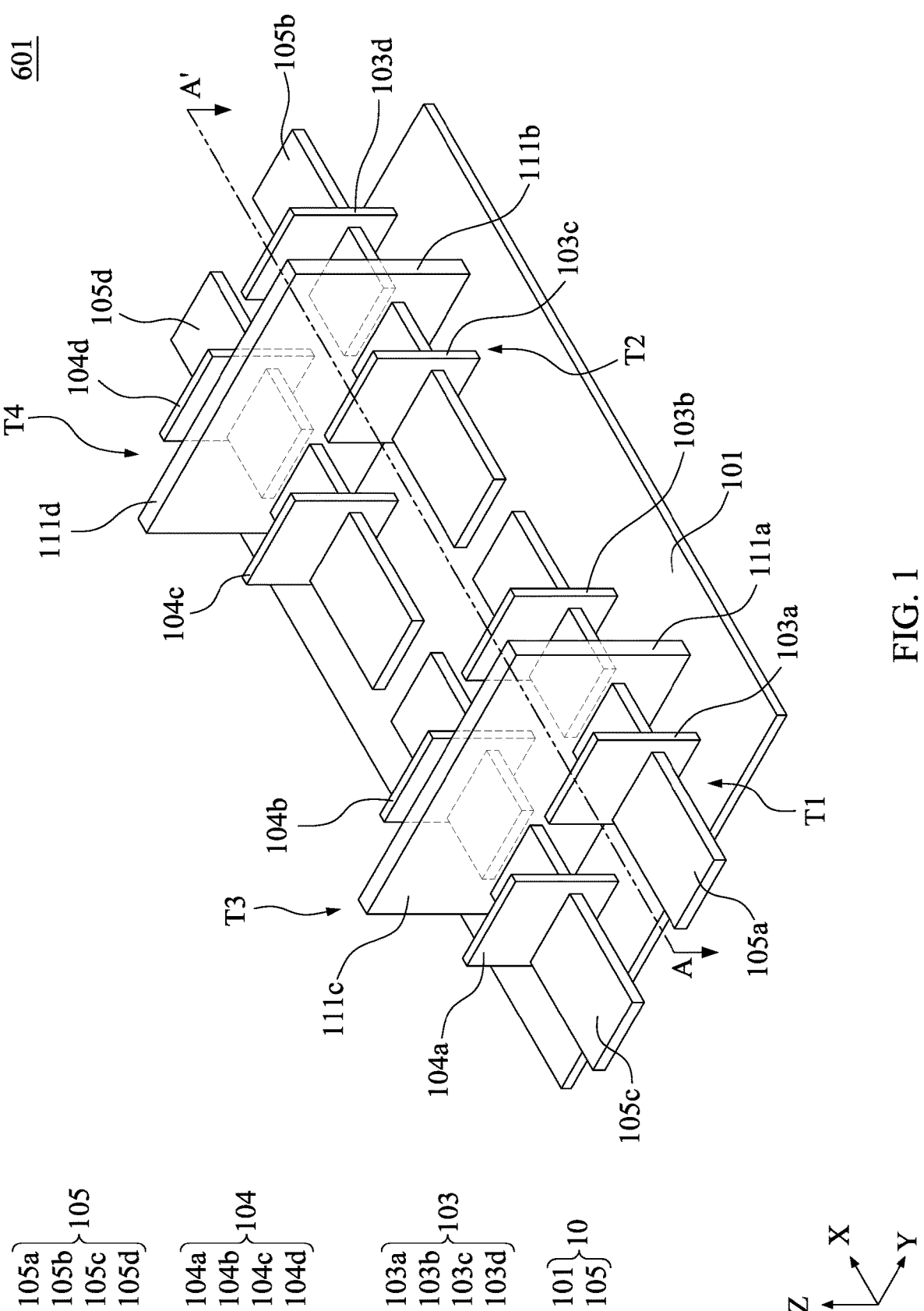
FIG. 1 is a schematic 3D diagram of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of time, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 2:
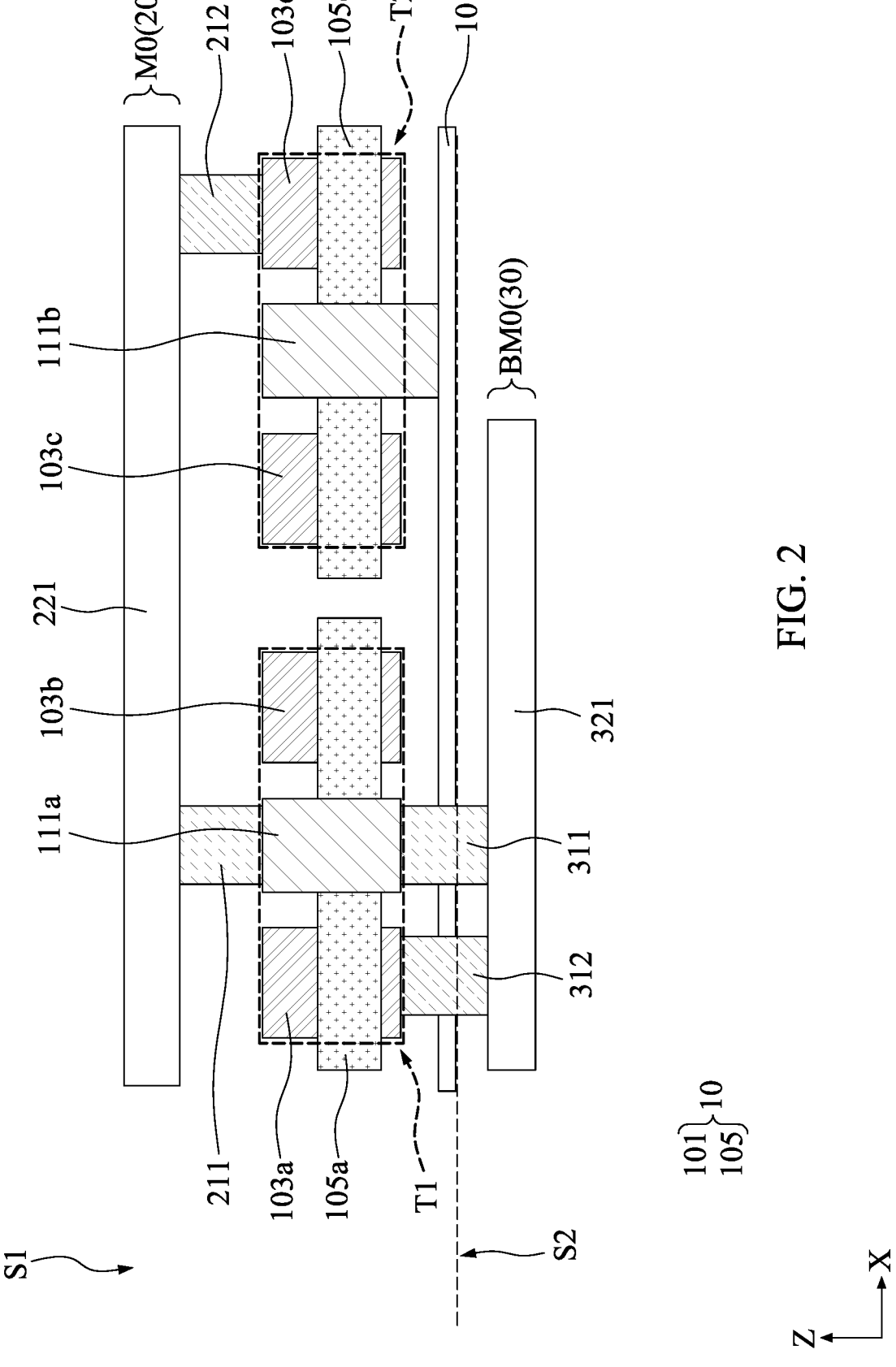
FIG. 2 is a schematic cross-sectional diagram of the semiconductor structure of FIG. 1 along a line A-A' in accordance with some embodiments of the present disclosure.

FIG. 1 is a schematic three-dimensional (3D) diagram of a semiconductor structure 601, and FIG. 2 is a schematic cross-sectional diagram of the semiconductor structure 601 of FIG. 1 along a line A-A' in accordance with some embodiments of the present disclosure. The semiconductor structure 601 includes a substrate layer 101 and an active layer 105 disposed over the substrate layer 101. The substrate layer 101 and the active layer 105 may collectively be referred to as a substrate 10. The active layer 105 is proximal to a front side S1 of the substrate 10, and the substrate layer 101 is proximal to a backside S2 of the substrate 10. In some embodiments, a bottom surface of the substrate layer 101 corresponds to a back surface of the substrate 10, wherein the back surface faces the backside S2 of the substrate 10.

In some embodiments, the active layer 105 is a layer of active regions of the substrate 10. In some embodiments, a plurality of fin structures, nanosheets or nanowires may be formed in the active layer 105. The active layer 105 can include multiple portions (e.g., 105a, 105b, 105c and 105d), and each portion can be an active region. In some embodiments, the active regions 105a and 105b are substantially aligned and extend along a same direction. In some embodiments, the active regions 105c and 105d are substantially aligned and extend along a same direction. In some embodiments, the active region 105a is adjacent to and substantially parallel to the active region 105c. In some embodiments, the active region 105b is adjacent to and substantially parallel to the active region 105d. In some embodiments, each of the active regions 105a, 105b, 105c and 105d includes at least one transistor (e.g., T1, T2, T3 or T4). The substrate 10 can include a bulk semiconductor material, such as silicon, or another semiconductor material, such as silicon germanium, silicon carbide, gallium arsenide, or the like. The substrate 10 may be of a first conductivity type, e.g., a P-type semiconductive substrate (acceptor type), or a second conductivity type, e.g., an N-type semiconductive substrate (donor type).

The transistors T1, T2, T3 and T4 can include one or more types of transistors, such as a multi-gate transistor, a gate-all-around field-effect transistor (GAAFET), a fin field-effect transistor (FinFET), a vertical transistor, a nanosheet transistor, a nanowire transistor, or a combination thereof. Each of the transistors T1, T2, T3 and T4 includes a pair of source/drain (S/D) structures (e.g., 103 and 104) surrounding the active layer 105, and a gate structure disposed between the pair of S/D structures and surrounding the active layer 105 (e.g., fin structures, nanosheets or nanowires of the active layer 105 between the S/D structures). In some embodiments, each of the S/D structures includes an upper portion disposed above the active layer 105 and a lower portion disposed below the active layer 105. In some embodiments, the S/D structures are epitaxial structures and include one or more semiconductor materials, such as polysilicon, silicon germanium, silicon carbide, gallium arsenide, or the like.

In some embodiments, the transistor T1 is disposed in the active region 105a and includes S/D structures 103a and 103b and a gate structure 111a disposed between the S/D structures 103a and 103b. In some embodiments, the transistor T2 is disposed in the active region 105b and includes S/D structures 103c and 103d and a gate structure 111b disposed between the S/D structures 103c and 103d. In some embodiments, the transistor T3 is disposed in the active region 105c and includes S/D structures 104a and 104b and a gate structure 111c disposed between the S/D structures 104a and 104b. In some embodiments, the transistor T4 is disposed in the active region 105d and includes S/D structures 104c and 104d and a gate structure 111d disposed between the S/D structures 104c and 104d. The S/D structures 103a and 103b and the gate structure 111a may be arranged along a first horizontal direction (e.g., X direction).

The S/D structures and the gate structure of each of the transistors T2, T3 and T4 may be arranged along the first horizontal direction. In some embodiments, the transistors T1 and T2 are arranged along the first horizontal direction. In some embodiments, the transistors T1 and T3 are arranged along a second horizontal direction (e.g., Y direction), which is substantially perpendicular to the first horizontal direction. In some embodiments, the S/D structures 103a and 104a are aligned along the second horizontal direction. In some embodiments, the S/D structures 103b and 104b are aligned along the second horizontal direction. In some embodiments, the S/D structures 103c and 104c are aligned along the second horizontal direction. In some embodiments, the S/D structures 103d and 104d are aligned along the second horizontal direction.

The gate structures 111a and 111c can be physically connected. In some embodiments, the gate structures 111a and 111c are a monolithic structure. The gate structures 111b and 111d can be physically connected. In some embodiments, the gate structures 111b and 111d are a monolithic structure. It should be noted that one of the pair of the S/D structures 103a and 103b can be a source structure, and another of the pair of the S/D structures 103a and 103b can be a drain structure. Similarly, the S/D structure 103c, 104a, or 104c can be a source structure or a drain structure, and the S/D structure 103d, 104b, or 104d can be a drain structure or a source structure.

Referring to FIG. 2, the semiconductor structure 601 may further include a front-side redistribution structure 20 disposed on the front side S1 of the substrate 10 and a backside redistribution structure 30 disposed on the backside S2 of the substrate 10. In other words, the front-side redistribution structure 20 is disposed on a side of the substrate 10 opposite to the backside redistribution structure 30.

Each of the front-side redistribution structure 20 and the backside redistribution structure 30 may include multiple metal line layers and multiple metal via layers. For example, the front-side redistribution structure 20 includes metal line layers M0 to M*n*, wherein the metal line layer M0 is a first metal line layer disposed over and closest to the substrate 10 of the front-side redistribution structure 20, and the metal line layer M*n* is a top-most metal line layer disposed over and farthest from the substrate 10 of the front-side redistribution structure 20. For another example, the backside redistribution structure 30 includes metal line layers BM0 to BM*n*, wherein the metal line layer BM0 is a first metal line layer disposed below and closest to the substrate 10 of the backside redistribution structure 30, and the metal line layer BM*n* is a bottom-most metal line layer disposed below and farthest from the substrate 10 of the front-side redistribution structure 20. The multiple metal via layers are arranged alternately between the metal line layers for electrical connection between the metal line layers. In some embodiments, each metal line layer is formed of metal lines and an intermetal dielectric (IMD) layer surrounding the metal lines. In some embodiments, each metal via layer is formed of metal vias and an IMD layer surrounding the metal vias.

It should be noted that the S/D structures 103 and 104 can be physically separated or electrically isolated from one another by isolations made of one or more dielectric materials. Similarly, the gate structures 111a and 111c, and the gate structures 111b and 111d, can be physically separated or electrically isolated from each other by the isolations. The isolations or the dielectric materials are not shown in the figures for a purpose of simplicity and brevity.

As shown in FIG. 2, in some embodiments, a metal line 221 disposed in the metal line layer M0 electrically connects to the gate structure 111a through a via 211 disposed in a via layer between the metal line layer M0 and the gate structure 111a. In some embodiments, the metal line 221 in the metal line layer M0 electrically connects to the S/D structure 103d through a via 212 disposed in the same via layer as the via 211. In some embodiments, a metal line 321 disposed in the metal line layer BM0 electrically connects to the gate structure 111a through a via 311 disposed in a via layer between the metal line layer BM0 and the gate structure 111a. In some embodiments, the via 311 penetrates the substrate layer 101 to electrically connect to the gate structure 111a from the backside S2 of the substrate 10. In some embodiments, the metal line 321 in the metal line layer BM0 electrically connects to the S/D structure 103a through a via 312 disposed in the same via layer as the via 311. In some embodiments, the via 312 penetrates the substrate layer 101 to electrically connect to the S/D structure 103a from the backside S2 of the substrate 10. It should be noted that routings and electrical connections between the different transistors T1 and T2 can be adjusted through the front-side redistribution structure 20 and the backside redistribution structure 30 according to different applications, and that FIG. 2 is for a purpose of illustration but is not intended to limit the present disclosure. In addition, a number of transistors in one active region of the active layer 105 can be adjusted according to different applications. The transistors (e.g., T1, T2, T3 and T4) collectively correspond to a data storage element, for example, a static random-access memory (SRAM) device, and signals for read and write (e.g., bit line signal, complementary bit line signal, and word line signal) can be transmitted through the front-side redistribution structure 20 and the backside redistribution structure 30.

It should be noted that a height of the gate structure 111a and a height of the gate structure 111b along vertical direction (e.g., Z direction) can be substantially equal or different. In some embodiments, the heights of the gate structures 111a and 111b are different. As shown in FIG. 2, the height of the gate structure 111a is less than the height of the gate structure 111b along the vertical direction. In some embodiments, the gate structure 111a is above and separated from the substrate layer 101. In some embodiments, the gate structure 111b contacts the substrate layer 101. However, the present disclosure is not limited thereto. In other embodiments, the heights of the gate structure 111a and the height of the gate structure 111b are substantially equal for a purpose of ease of manufacturing process.

Figure 3:
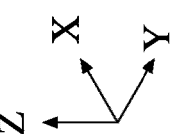
FIG. 3 is a schematic 3D diagram of a semiconductor structure in accordance with some embodiments of the present disclosure.
Figure 4:
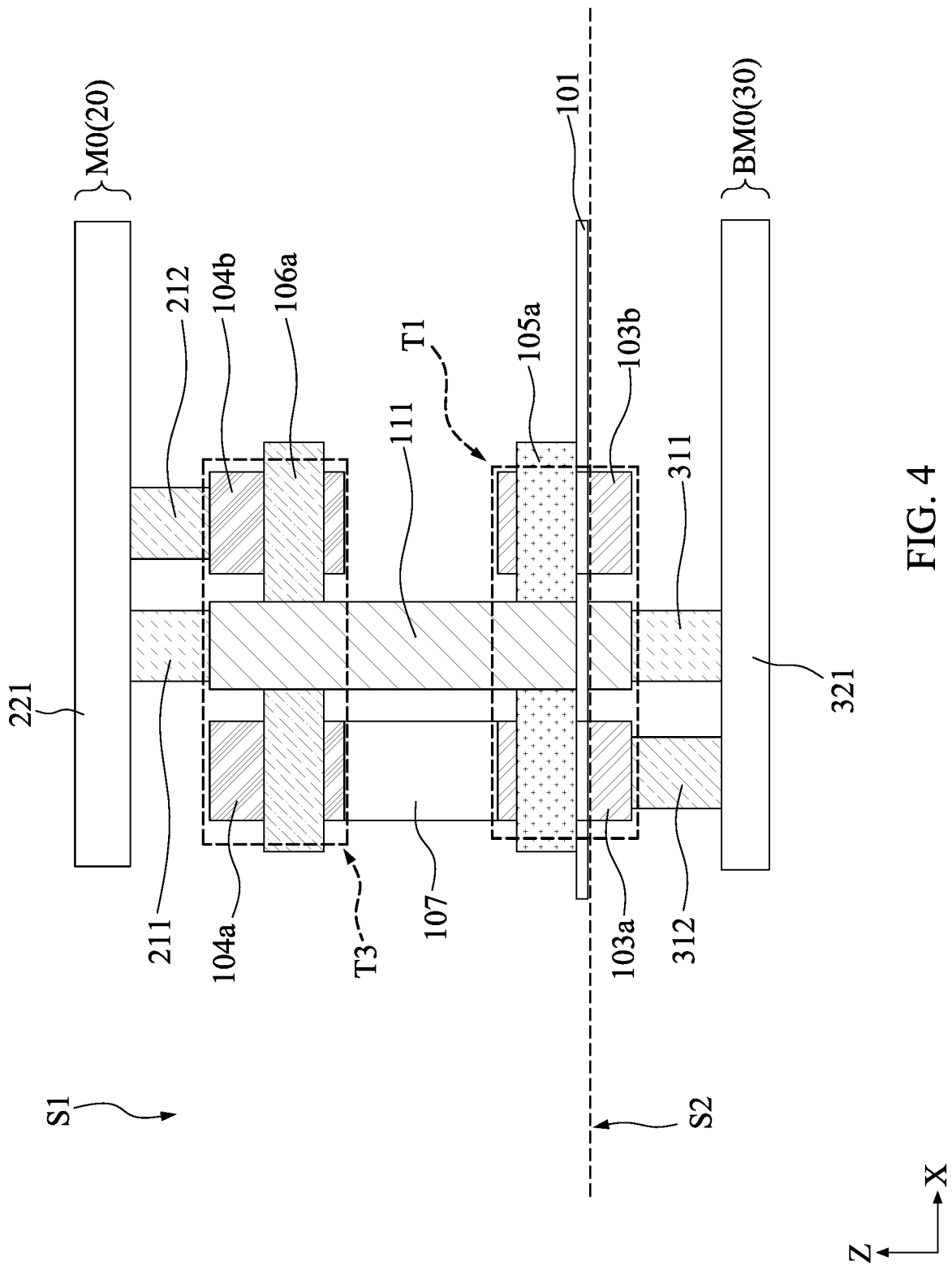
FIG. 4 is a schematic cross-sectional diagram of the semiconductor structure of FIG. 3 along a line B-B' in accordance with some embodiments of the present disclosure.

FIG. 3 is a schematic 3D diagram of a semiconductor structure 602, and FIG. 4 is a schematic cross-sectional diagram of the semiconductor structure 602 of FIG. 3 along a line B-B' in accordance with some embodiments of the present disclosure. The semiconductor structure 602 can be similar to the semiconductor structure 601, except that the semiconductor structure 602 includes another active layer 106 disposed above the active layer 105, and the transistors T3 and T4 are formed in and surround the active layer 106. For a purpose of brevity, in the following illustration, only differences between the semiconductor structures 601 and 602 are described. It should be noted that such omission of similar features of the semiconductor structures 601 and 602 is not intended to limit the present disclosure.

The substrate layer 101 and the active layers 105 and 106 are collectively referred to as the substrate 10. The active layer 105 is disposed between the active layer 106 and the substrate layer 101 along a vertical direction (e.g., Z direction). The active layer 106 is proximal to the front side S1 of the substrate 10, and the substrate layer 101 is proximal to the backside S2 of the substrate 10. In other words, the different active layers 105 and 106 are at different elevations above the substrate layer 101, and the active regions in a same active layer are disposed at a same elevation.

Similar to the active layer 105, the active layer 106 can include multiple active regions. In some embodiments, the active layer 105 includes active regions 105a and 105b, and the active layer 106 includes active regions 106a and 106b substantially aligned with the active regions 105a and 105b, respectively, along the vertical direction. In some embodiments, the active regions 105a and 105b are substantially parallel. In some embodiments, the active regions 105a and 105b are arranged along the second horizontal direction, and each of the active regions 105a and 105b extends along the first horizontal direction, which is substantially perpendicular to the second horizontal direction and the vertical direction.

The transistors T1, T2, T3 and T4 can include one or more types of transistors, such as a multi-gate transistor, a gate-all-around field-effect transistor (GAAFET), a fin field-effect transistor (FinFET), a vertical transistor, a nanosheet transistor, a nanowire transistor, or a combination thereof. In some embodiments, the transistors T1, T2, T3 and T4 are complementary field-effect transistors (CFETs).

In some embodiments, the gate structures of the transistors T1, T2, T3 and T4 are all connected. In some embodiments, the gate structures of the transistors T1, T2, T3 and T4 are a monolithic structure. In some embodiments, the transistors T1, T2, T3 and T4 have a common gate structure 111. In some embodiments, the common gate structure 111 extends across the active layers 105 and 106. In some embodiments, the common gate structure 111 surrounds the active layers 105 and 106 respectively. In some embodiments, the common gate structure 111 extends from above the active layer 106 to below the substrate layer 101.

In some embodiments, the transistor T1 is disposed in the active region 105a, and the S/D structures 103a and 103b of the transistor T1 are disposed in and surround the active region 105a on two opposite sides of the common gate structure 111. In some embodiments, the transistor T2 is disposed in the active region 105b, and the S/D structures 103c and 103d of the transistor T2 are disposed in and surround the active region 105b on two opposite sides of the common gate structure 111. In some embodiments, the transistor T3 is disposed in the active region 106a, and the S/D structures 104a and 104b of the transistor T3 are disposed in and surround the active region 106a on two opposite sides of the common gate structure 111. In some embodiments, the transistor T4 is disposed in the active region 106b, and the S/D structures 104c and 104d of the transistor T4 are disposed in and surround the active region 106b on two opposite sides of the common gate structure 111. In some embodiments, the S/D structures 103a and 104a are vertically aligned. In some embodiments, the S/D structures 103b and 104b are vertically aligned. In some embodiments, the S/D structures 103c and 104c are vertically aligned. In some embodiments, the S/D structures 103d (not visible in FIG. 3) and 104d are vertically aligned. The S/D structures 103a to 103d and 104a to 104d may be electrically isolated from one another by an isolation (or dielectric material) or electrically connected through an inter-S/D structure 107 as shown in FIG. 4. The inter-S/D structure 107 can include conductive material or semiconductor material, such as polysilicon, germanium, silicon germanium, or other suitable materials.

As shown in FIG. 4, similar to the embodiments shown in FIG. 2, a metal line 221 is disposed in a metal line layer M0, and a metal line 321 is disposed in a metal line layer BM0 for electrical connection and circuit routing to achieve a data storage element. In some embodiments, the common gate structure 111 is electrically connected to the metal line 221 from the front side S1 of the substrate 10 through a via 211. In some embodiments, the common gate structure 111 is electrically connected to the metal line 321 from the back-side S2 of the substrate 10 through a via 311. In some embodiments, each of the S/D structures 103a to 103d includes an upper portion disposed above the active layer 105. In some embodiments, each of the S/D structures 103a to 103d includes a lower portion disposed below the active layer 105. In some embodiments, each of the S/D structures 104a to 104d includes an upper portion disposed above the active layer 106. In some embodiments, each of the S/D structures 104a to 104d includes a lower portion disposed below the active layer 106. In some embodiments, the inter-S/D structure 107 is entirely disposed between the active layers 105 and 106. In some embodiments, the inter-S/D structure 107 is entirely disposed between the S/D structures 104a and 103a.

FIGS. 5 to 14 are schematic 3D diagrams of semiconductor structures 603 to 612 for illustrations of different arrangements of signal lines in order to achieve a data storage device with improved resistance and/or reduced coupling effect in accordance with different embodiments of the present disclosure. Each of the semiconductor structures 603 to 612 includes the semiconductor structure 602 shown in FIG. 3 as exemplary illustration. In other embodiments, the semiconductor structure 601 can be applied to achieve a data storage device, and the configuration is not limited herein.

Figure 5:
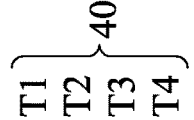
Figure 5:
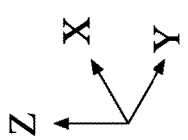

As shown in FIG. 5, in some embodiments, metal lines 222 and 223 are disposed in the metal line layer M0 above the transistors T1 to T4 (collectively referred to as a transistor array 40 for a purpose of illustration), and metal lines 322 and 323 are disposed in the metal line layer BM0 below the substrate layer 101. The metal lines 222, 223, 322 and 323 are for transmission of bit line signals and complementary bit line signals. In some embodiments, the metal lines 222, 223, 322 and 323 are substantially parallel to one another. In some embodiments, each of the metal lines 222, 223, 322 and 323 extends along the first horizontal direction. In some embodiments, the metal line 222 is substantially symmetrical to the metal line 322 with respect to the transistor array 40. In some embodiments, the metal line 223 is substantially symmetrical to the metal line 323 with respect to the transistor array 40.

In some embodiments, different bit line signals may be designed to be transmitted on two opposite sides of the substrate 10 (or two opposite sides of the transistor array 40) for a purpose of reduction of electrical resistance. In some embodiments, the metal lines 222 and 223 are for transmission of a bit line signal and its complementary signal. In some embodiments, the metal line 222 is a bit line, and the metal line 223 is a complementary bit line (or a bit line bar) of the metal line 222. In some embodiments, the metal lines 322 and 323 are for transmission of another bit line signal and its complementary signal. In some embodiments, the metal line 322 is a bit line, and the metal line 323 is a complementary bit line (or a bit line bar) of the metal line 322.

Since the front-side redistribution structure 20 (including the metal line layer M0) is formed separately from the backside redistribution structure 30 (including the metal line layer BM0), it is easy to integrate different conductive materials of the metal lines in the front-side redistribution structure 20 and the backside redistribution structure 30. In addition, formation of the front-side redistribution structure 20 should be precisely controlled in order to prevent damage of electrical elements formed by the front-end of line (FEOL) manufacturing process. It is difficult to integrate new and/or different materials of metal lines of the front-side redistribution structure 20. However, it is easier to introduce new or different materials of metal lines of the backside redistribution structure 30. Therefore, an electrical resistance of a bit line and a complementary bit line can be adjusted or reduced by applying a material different from that of the front-side redistribution structure 20. In some embodiments, a material of the metal lines 322 and 323 is different from a material of the metal lines 222 and 223. In some embodiments, the material of the metal lines 322 and 323 has an electrical resistance substantially lower than a resistance of the material of the metal lines 222 and 223.

As shown in FIG. 5, in some embodiments, a bit line signal and its complementary bit line signal are arranged to be transmitted on two opposite sides of the substrate 10 (or two opposite sides of the transistor array 40) for a purpose of reduction of a cross-coupling effect. In some embodiments, the metal lines 222 and 322 are for transmission of a bit line signal and its complementary signal. In some embodiments, the metal lines 222 and 322 are vertically aligned. In some embodiments, the metal line 222 is a bit line, and the metal line 322 is a complementary bit line (or a bit line bar) of the metal line 222. In some embodiments, the metal lines 223 and 323 are for transmission of another bit line signal and its complementary signal. In some embodiments, the metal lines 223 and 323 are vertically aligned. In some embodiments, the metal line 223 is a bit line, and the metal line 323 is a complementary bit line (or a bit line bar) of the metal line 223. In addition, a material of the metal lines 322 and 323 can be different from a material of the metal lines 222 and 223 as illustrated above, and thus, an overall electrical resistance of the bit lines and the complementary bit lines can be also reduced.

As shown in FIG. 5, in some embodiments, a bit line pair (including a bit line and a complementary bit line) and a fly bit line pair (including a fly bit line and a complementary fly bit line) are arranged to be disposed on two opposite sides of the substrate 10 (or two opposite sides of the transistor array 40) for a purpose of improvement of routing resource in the front-side redistribution structure 20. The fly bit line pair is for a purpose of reduction of electrical resistance of the bit line pair. In some embodiments, the fly bit line is for transmission of a signal identical to a bit line signal of the bit line. In some embodiment, the fly bit line is for transmission of a signal identical to a complementary signal of a complimentary bit line. In some embodiments, the bit line pair includes two adjacent bit lines (e.g., 222 and 223 or 322 and 323). In some embodiments, the fly bit line pair includes two adjacent bit lines (e.g., 322 and 323 or 222 and 223), which are disposed opposite to the bit line pair with respect to substrate 10 (or two opposite sides of the transistor array 40) . . . . In a comparative embodiment when the fly bit line pair and the bit line par are both disposed in the front-side redistribution structure 20, the fly bit line pair is disposed in two metal line layers above the bit line pair (bit lines and word lines are alternately arranged in different metal line layers of the front-side redistribution structure 20, and therefore the fly bit line pair cannot be arranged in a metal line layer directly over the metal line layer of the bit line pair). Therefore, a routing design of the comparative embodiment is more complicated than that of the embodiments shown in FIG. 5. For a purpose of increase of routing resource in the front-side redistribution structure 20, the fly bit lines can be disposed in the backside redistribution structure 30, and therefore routing resources in the front-side redistribution structure 20 can be improved.

In some embodiments, the metal lines 222 and 223 are a bit line pair. In some embodiments, the metal lines 322 and 323 are a fly bit line pair. In some embodiments, the metal lines 322 and 323 are a bit line pair. In some embodiments, the metal lines 222 and 223 are a fly bit line pair.

Figure 6:
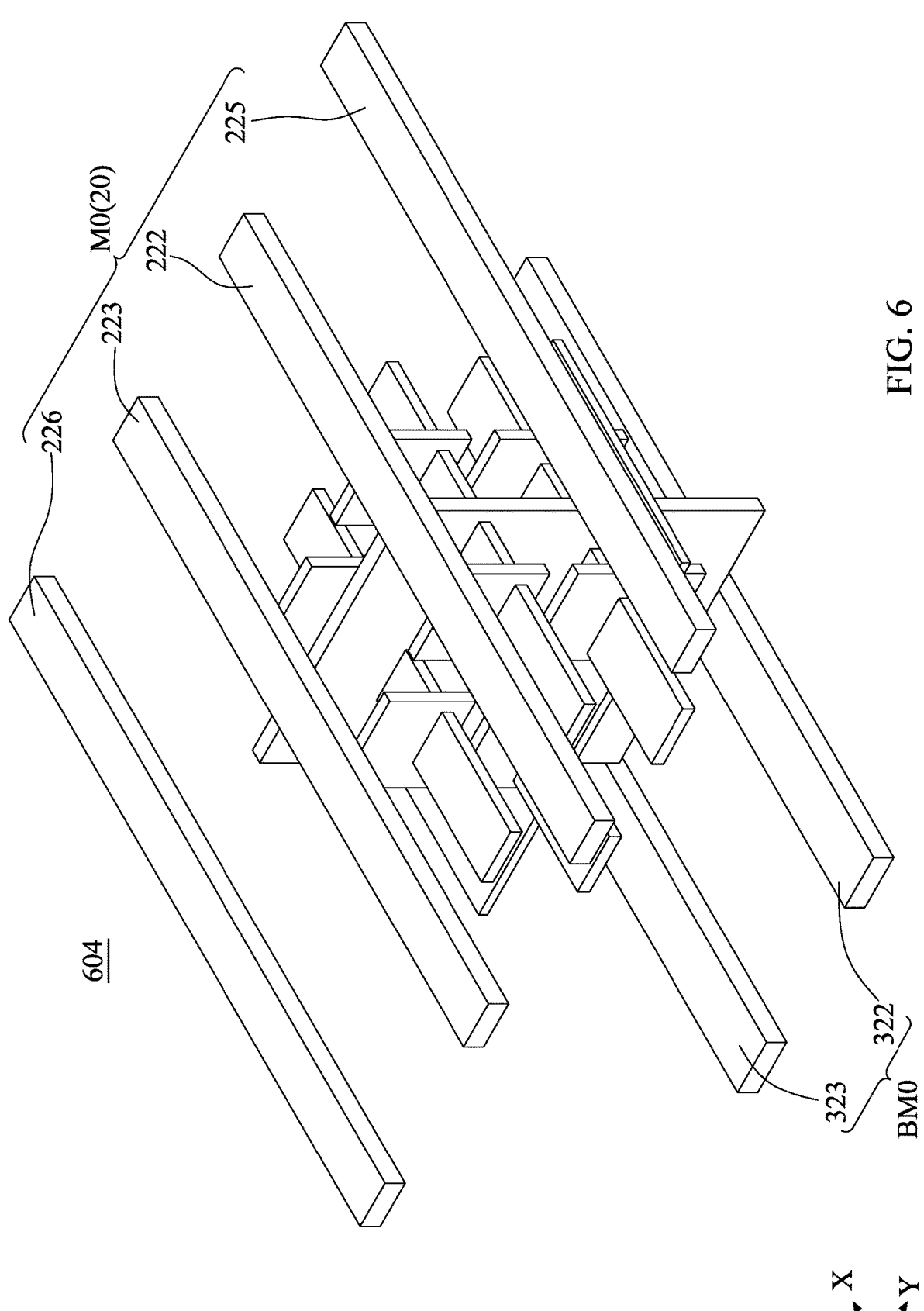
Figure 7:
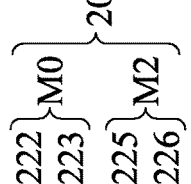
Figure 7:
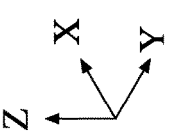
Figure 8:
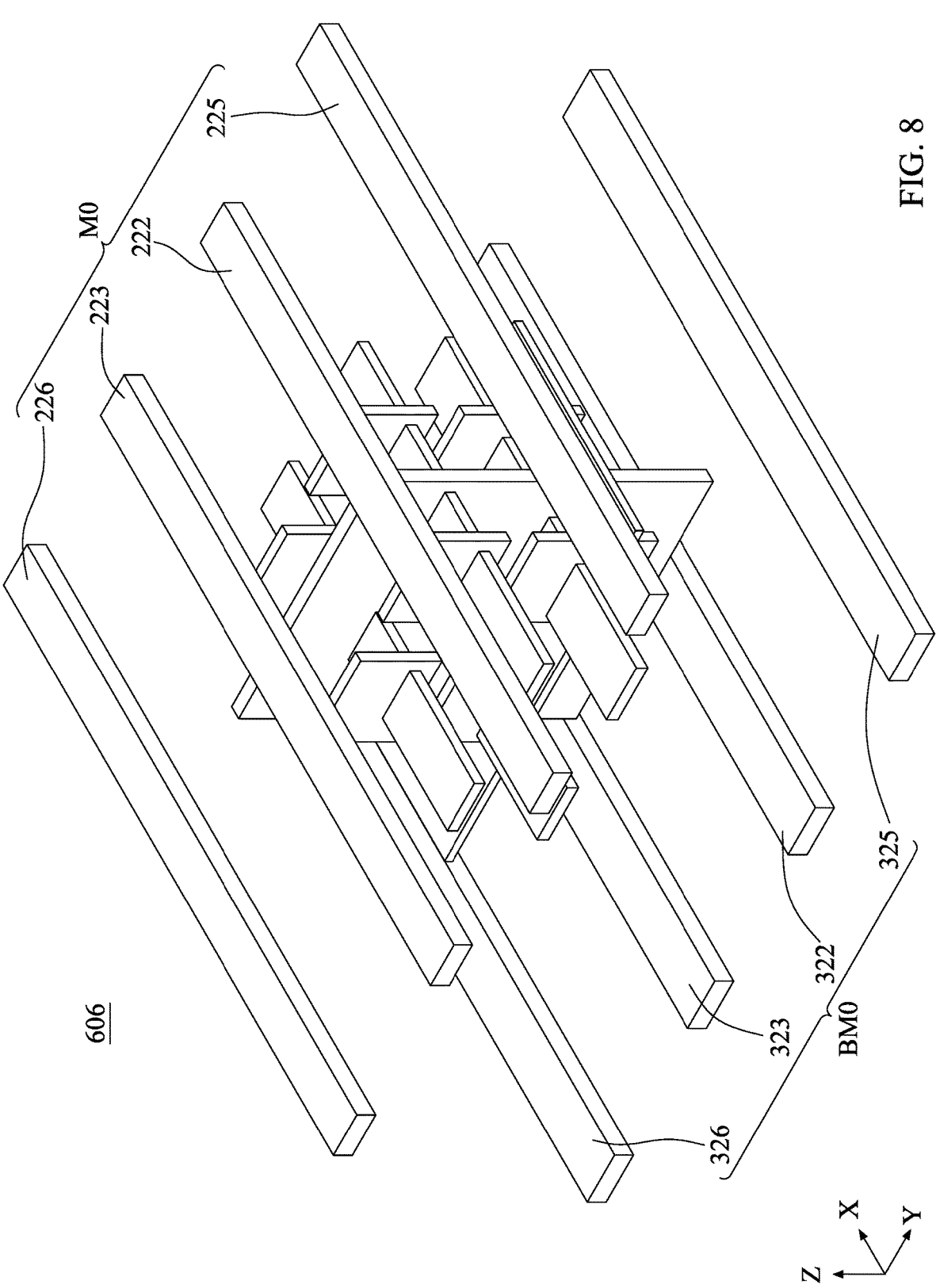

FIGS. 6 to 8 are schematic 3D diagrams of semiconductor structures 604 to 606 including a pair of bit lines, a pair of fly bit lines, and a pair of complementary bit lines in accordance with different embodiments of the present disclosure.

In some embodiments as shown in FIG. 6, the semiconductor structure 604 is similar to the semiconductor structure 603 with additional metal lines 225 and 226 disposed in the metal line layer M0. The metal lines 225 and 226 can for transmission of signals other than bit line signals for a purpose of prevention of affecting signal judgement to the bit line signals and the complementary bit line signals through the metal lines 222 and 223. In some embodiments, the metal lines 226 and 223 are a first bit line pair, the metal lines 222 and 225 are a second bit line pair, and the metal lines 322 and 323 are a fly bit line pair, which is paired to the first bit line pair or the second bit line pair. In some embodiments, only one of the first bit line pair and the second bit line pair has a paired fly bit line pair disposed in the backside redistribution structure 30. It should be noted that the paired fly bit line pair may or may not be vertically aligned with it paired bit line pair. In some embodiments, the metal lines 322 and 323 are not vertically aligned with the paired metal lines 226 and 223 or 222 and 225 as shown in FIG. 6. In some embodiments, the metal lines 322 and 323 are vertically overlapped by the paired metal lines 226 and 223 respectively. In some embodiments, the metal lines 322 and 323 are vertically overlapped by the paired metal lines 222 and 225 respectively.

In some embodiments as shown in FIG. 7, the semiconductor structure 605 is similar to the semiconductor structure 603, except that the semiconductor structure 605 includes additional metal lines 225 and 226 disposed in a metal line layer M2 above the metal line layer M0. The metal lines 225 and 226 can be bit lines, fly bit lines or complementary bit lines according to different arrangements of the metal lines 222, 223, 322 and 323 as depicted in FIG. 5 and described in relevant paragraphs above. As mentioned above, repeated description is omitted herein for a purpose of brevity.

In some embodiments as shown in FIG. 6, the semiconductor structure 604 is similar to the semiconductor structure 603 with additional metal lines 225 and 226 disposed in the metal line layer M0. The metal lines 225 and 226 can for transmission of signals other than bit line signals for a purpose of prevention of affecting signal judgement to the bit line signals and the complementary bit line signals through the metal lines 222 and 223. In some embodiments, the metal lines 226 and 223 are a first bit line pair, the metal lines 222 and 225 are a second bit line pair, and the metal lines 322 and 323 are a fly bit line pair, which is paired to the first bit line pair or the second bit line pair. In some embodiments, only one of the first bit line pair and the second bit line pair has a paired fly bit line pair disposed in the backside redistribution structure 30. It should be noted that the paired fly bit line pair may or may not be vertically aligned with it paired bit line pair. In some embodiments, the metal lines 322 and 323 are not vertically aligned with the paired metal lines 226 and 223 or 222 and 225 as shown in FIG. 6. In some embodiments, the metal lines 322 and 323 are vertically overlapped by the paired metal lines 226 and 223 respectively. In some embodiments, the metal lines 322 and 323 are vertically overlapped by the paired metal lines 222 and 225 respectively.

FIGS. 9 to 11 are schematic 3D diagrams of semiconductor structures 607 to 609 for illustration of different arrangements of word lines in order to achieve a data storage device with improved resistance and/or reduced coupling effect in accordance with different embodiments of the present disclosure.

As shown in FIG. 9, in some embodiments, a metal line 331 is disposed in a metal line layer BM1 below the substrate layer 101 for a purpose of transmission of word line signals through the backside redistribution structure 30. In some embodiments, the metal line layers for transmission of word line signals are referred to as word line layers, and the metal line layers for transmission of bit line signals and complementary bit line signals are referred to as bit line layers. The word line layers and the bit line layers are alternately arranged along the vertical direction in the front-side redistribution structure 20 or the backside redistribution structure 30 starting with a bit line layer (i.e., a first bit line layer is the metal line layer M0 or BM0, and a first word line layer is the metal line layer M1 or BM0). In some embodiments, the metal line 331 extends along the second horizontal direction. In some embodiments, the metal line 331 is substantially aligned with the common gate structure 111. In some embodiments, the metal line 331 is substantially parallel to the common gate structure 111. The arrangement of the metal line 331 (functioning as a word line) in the metal line layer BM1 can provide increase of routing resources in the front-side redistribution structure 20. In addition, an electrical resistance of the metal line 331 can be reduced compared to a word line disposed in the front-side redistribution structure 20.

As shown in FIG. 10, the semiconductor structure 608 can be similar to the semiconductor 607, except that the semiconductor structure 608 includes an additional metal line 231 disposed in a metal line layer M1 above the metal line layer M0 shown in FIG. 5. In some embodiments, the metal lines 231 and 331 are for a purpose of transmission of different word line signals through the front-side redistribution structure 20 and the backside redistribution structure 30. In some embodiments, the metal lines 231 and 331 referred to as double word lines, and the metal lines 231 and 331 are configured to transmit identical signals for a purpose of reduction of an overall electrical resistance of word lines. In some embodiments, the metal lines 231 and 331 are in parallel connection when they are double word lines. In some embodiments, the metal line 231 extends along the second horizontal direction. In some embodiments, the metal line 231 is substantially aligned with the common gate structure 111. In some embodiments, the metal line 231 is substantially parallel to the common gate structure 111. In some embodiments, the metal line 231 is substantially symmetrical to the metal line 331 with respect to the common gate structure 111.

As shown in FIG. 11, the semiconductor structure 609 can be similar to the semiconductor structure 608, except that the semiconductor structure 609 includes an additional metal line 251 disposed in a metal line layer M3 above the metal line layer M1. Similar to the purposes described above, in some embodiments, the metal lines 231, 331 and 251 are for a purpose of transmission of different word line signals through the front-side redistribution structure 20 and the backside redistribution structure 30. In some embodiments, the metal lines 231, 331 and 251 are for a purpose of reduction of an overall electrical resistance of word lines. Since the metal lines 231, 331 and 251 are disposed in different front-side and backside redistribution structure 30s on opposite sides of the substrate 10, a complexity of routing can be reduced, and the routing resources can be increased. In addition, an overall electrical resistance of word lines can be reduced compared to that of a configuration in which all of the word lines are disposed on one side of the substrate 10.

Figure 12:
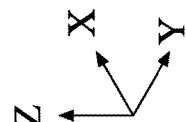

FIG. 12 is a schematic 3D diagram of a semiconductor structure 610 showing positional relationships between bit lines and word lines in accordance with some embodiments of the present disclosure. In some embodiments, the semiconductor structure 610 includes the metal lines 222, 223, 322 and 323 shown in FIG. 5 and the metal line 331 shown in FIG. 9 for a purpose of illustration. In some embodiments, the metal line 331 is substantially perpendicular to one of the metal lines 222, 223, 322 or 323. In some embodiments, the metal line 331 is electrically isolated or physically separated from the metal lines 322 and 323, for example, by an IMD layer (not shown) of the backside redistribution structure 30.

Figure 13:
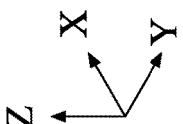

FIG. 13 is a schematic 3D diagram of a semiconductor structure 611 showing positional relationships between bit lines and word lines in accordance with some embodiments of the present disclosure. In some embodiments, the semiconductor structure 611 includes the metal lines 222, 223, 322 and 323 shown in FIG. 5, the metal line 331 shown in FIG. 9, and the metal line 231 shown in FIG. 10 for a purpose of illustration. In some embodiments, the metal lines 231 and 331 are substantially perpendicular to one of the metal lines 222, 223, 322 and 323. In some embodiments, the metal line 331 is electrically isolated or physically separated from the metal lines 322 and 323, for example, by an IMD layer (not shown) of the backside redistribution structure 30. Similarly, in some embodiments, the metal line 231 is electrically isolated or physically separated from the metal lines 222 and 223. The metal lines shown in FIGS. 5 to 8 can be applied to any of the structures shown in FIGS. 9 to 11, and description is omitted herein for a purpose of brevity. However, such omission is not intended to limit the present disclosure.

Figure 14:
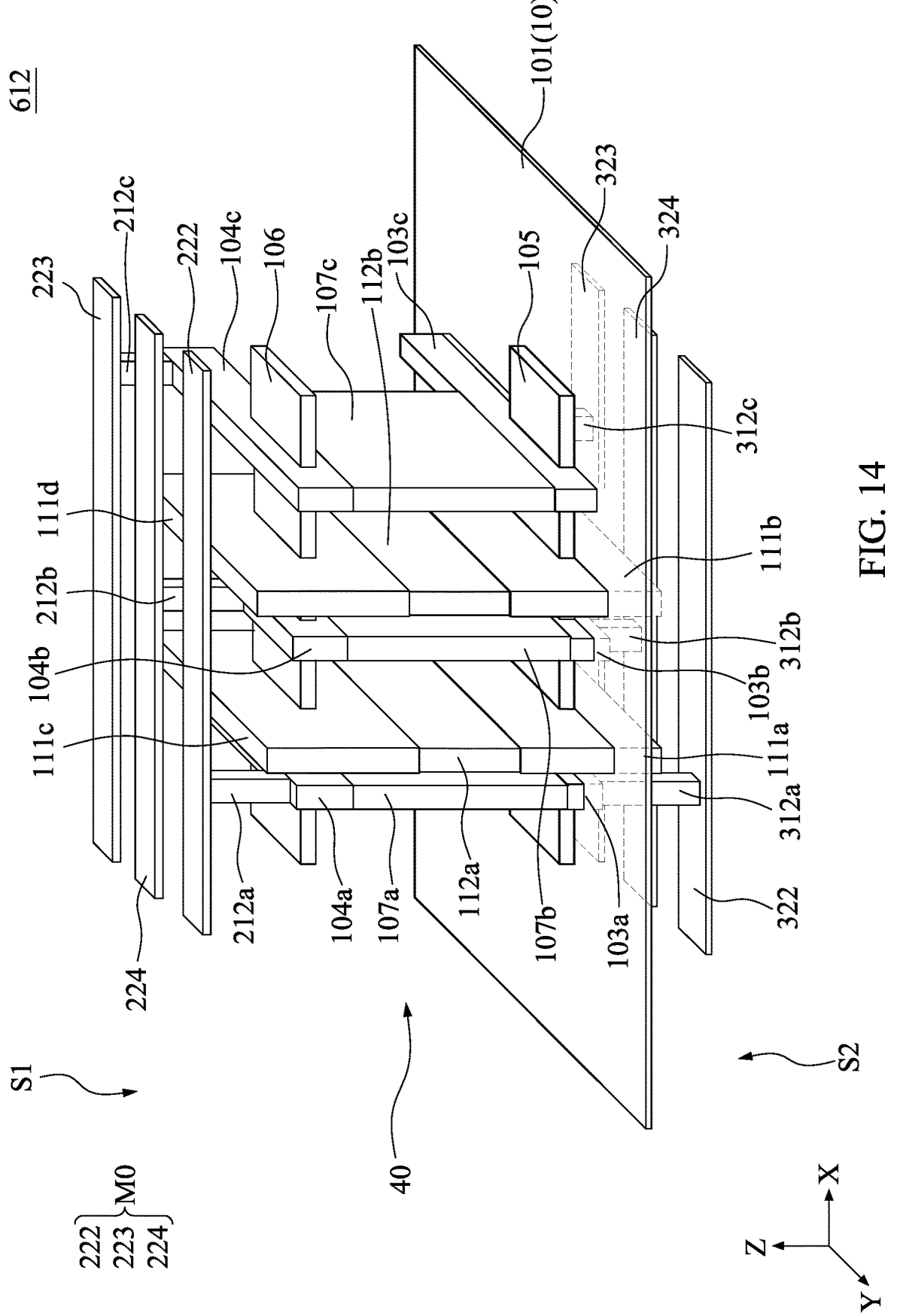
FIG. 14 is a schematic 3D diagram of a semiconductor structure in accordance with some embodiments of the present disclosure.
Figure 15:
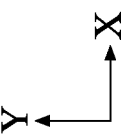
FIG. 15 is a schematic top-view perspective of the semiconductor structure shown in FIG. 14 in accordance with some embodiments of the present disclosure.
Figure 16:
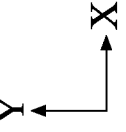
FIG. 16 is a schematic bottom-view perspective of the semiconductor structure shown in FIG. 14 in accordance with some embodiments of the present disclosure.

FIG. 14 is a schematic 3D diagram of a semiconductor structure 612, FIG. 15 is a schematic top-view perspective of the semiconductor structure 612 shown in FIG. 14, and FIG. 16 is a schematic bottom-view perspective of the semiconductor structure 612 shown in FIG. 14 in accordance with some embodiments of the present disclosure.

As shown in FIG. 14, the semiconductor structure 612 can be similar to the semiconductor structure 603, except the semiconductor structure 612 can include a different number of transistors in the transistor array 40, and additional metal lines 224 and 324 for power/ground connection. In some embodiments, the transistor array 40 includes S/D structures 103a, 103b and 103c disposed in and surrounding an active layer 105. In some embodiments, the transistor array 40 includes gate structures 111a and 111b disposed in and surrounding the active layer 105. In some embodiments, the gate structure 111a is between the S/D structures 103a and 103b along a first horizontal direction (e.g., X direction). In some embodiments, the gate structure 111b is between the S/D structures 103b and 103c along the first horizontal direction.

In some embodiments, the transistor array 40 includes S/D structures 104a, 104b and 104c disposed in and surrounding an active layer 106, which is disposed above the active layer 105. In some embodiments, the S/D structures 104a, 104b and 104c are disposed above and vertically aligned with the S/D structures 103a, 103b and 103c, respectively. In some embodiments, the transistor array 40 includes gate structures 111c and 111d disposed in and surrounding the active layer 106. In some embodiments, the gate structures 111c and 111d are disposed above and vertically aligned with the gate structures 111a and 111b. In some embodiments, the gate structure 111c is electrically isolated or physically separated from the gate structure 111a by an isolation 112a. In some embodiments, the gate structure 111d is electrically isolated or physically separated from the gate structure 111b by an isolation 112b. In some embodiments, the gate structure 111c is between the S/D structures 104a and 104b along the first horizontal direction. In some embodiments, the gate structure 111d is between the S/D structures 104b and 104c along the first horizontal direction.

In some embodiments, the transistor array 40 includes inter-S/D structures 107a, 107b and 107c for electrical connections between the S/D structures 103a and 104a, 103b and 104b, and 103c and 104c, respectively. In some embodiments, the inter-S/D structures 107a, 107b and 107c are disposed between the active layers 105 and 106 along the vertical direction. In some embodiments, the inter-S/D structure 107a is within a vertical projection of the S/D structure 103a or 104a. In some embodiments, the inter-S/D structure 107b is within a vertical projection of the S/D structure 103b or 104b. In some embodiments, the inter-S/D structure 107c is within a vertical projection of the S/D structure 103c or 104c.

The metal lines 222, 223, 322 and 323 are bit lines, complementary bit lines, and/or fly bit lines as described above, and repeated description is omitted herein. In some embodiments, the metal line 222 is electrically connected to the S/D structure 104a from the front side S1 of the substrate 10 through a via 212a disposed between the transistor array 40 and the metal line layer M0. In some embodiments, the metal line 223 is electrically connected to the S/D structure 104c from the front side S1 of the substrate 10 through a via 212c disposed between the transistor array 40 and the metal line layer M0. In some embodiments, the metal line 322 is electrically connected to the S/D structure 103a from the backside S2 of the substrate 10 through a via 312a disposed between the transistor array 40 and the metal line layer BM0. In some embodiments, the metal line 323 is electrically connected to the S/D structure 103c from the backside S2 of the substrate 10 through a via 312c disposed between the transistor array 40 and the metal line layer BM0.

The metal line 224 can be disposed between the metal lines 222 and 223 in the metal line layer M0. In some embodiments, the metal line 224 is for power/ground connection to the transistor array 40. In other words, a power/ground line (i.e. 224) is disposed between, for example, adjacent bit lines (e.g., 222 and 223) in the metal line layer M0 along a second horizontal direction (e.g., Y direction). In some embodiments, the metal line 224 is electrically connected to the S/D structure 104b from the front side S1 of the substrate 10 through a via 212b disposed between the transistor array 40 and the metal line layer M0. The metal line 324 can be disposed between the metal lines 322 and 323 in the metal line layer BM0. In some embodiments, the metal line 324 is for power/ground connection to the transistor array 40. In other words, a power/ground line (i.e. 224) is disposed between, for example, adjacent complementary bit lines (e.g., 322 and 323) in the metal line layer BM0 along the second horizontal direction. In some embodiments, the metal line 324 is electrically connected to the S/D structure 103b from the backside S2 of the substrate 10 through a via 312b disposed between the transistor array 40 and the metal line layer BM0.

For ease of formation, widths of metal lines in a same metal line layer are substantially equal. In some embodiments, as shown in FIG. 15, the metal lines 222, 223, and 224 have a substantially equal width W20, wherein the width W20 is measured along the second horizontal direction. In some embodiments, as shown in FIG. 16, the metal lines 322, 323, and 324 have a substantially equal width W30, wherein the width W30 is measured along the second horizontal direction. Since routings in the front-side redistribution structure 20 can be much more complex than routings in the backside redistribution structure 30, a width of a metal line in a metal line layer (e.g., M0) in the front-side redistribution structure 20 is substantially less than a width of a metal line in a corresponding metal line layer (e.g., BM0) in the backside redistribution structure 30.

Therefore, the present disclosure provides a semiconductor structure having a data storage element (e.g., a static random-access memory (SRAM)) with memory signal transmission through a backside redistribution structure. As a result, a cross-coupling effect can be reduced, and routing resources can be increased. In addition, an overall electrical resistance may also be reduced since it is easier to change materials of metal lines in the backside redistribution structure than to change materials of metal lines in the front-side redistribution structure.

In accordance with some embodiments of the disclosure, a semiconductor structure is provided. The semiconductor structure includes a substrate having a front side and a backside opposite to the front side, wherein the substrate includes a substrate layer, a first active layer disposed above the substrate layer, and a second active layer disposed above the first active layer, the second active layer is proximal to the front side, and the substrate layer is proximal to the backside; a data storage element, disposed in and surrounding the first active layer and the second active layer; a first bit line set, including a first bit line and a first complementary bit line, wherein at least one of the first bit line and the first complementary bit line is disposed on the front side of the substrate above the second active layer; and a second bit line set, including a second bit line and a second complementary bit line, wherein at least one of the second bit line and the second complementary bit line is disposed on the backside of the substrate below the substrate layer.

In accordance with some embodiments of the disclosure, a semiconductor structure is provided. The semiconductor structure includes a substrate having a front side and a backside opposite to the front side, wherein the substrate includes a substrate layer, a first active layer disposed above the substrate layer, and a second active layer disposed above the first active layer, the second active layer is proximal to the front side, and the substrate layer is proximal to the backside; a data storage element, disposed in and surrounding the first active layer and the second active layer; and a first word line, disposed on the backside of the substrate below the substrate layer.

In accordance with some embodiments of the disclosure, a semiconductor structure is provided. The semiconductor structure includes a substrate having a front side and a backside opposite to the front side, wherein the substrate includes a substrate layer proximal to the backside; a plurality of complementary FETs (CFETs), disposed on the substrate layer, wherein the CFETs are proximal to the front side of the substrate and collectively correspond to a data storage element; a first bit line set, including a first bit line and a first complementary bit line, wherein at least one of the first bit line and the first complementary bit line is disposed on the front side of the substrate above the CFETs; a second bit line set, including a second bit line and a second complementary bit line, wherein at least one of the second bit line and the second complementary bit line is disposed on the backside of the substrate below the substrate layer; and a first power/ground line, disposed on the backside of the substrate below the substrate layer at an elevation same as that of the at least one of the second bit line and the second complementary bit line.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a substrate, having a front side and a backside opposite to the front side, wherein the substrate includes a substrate layer, a first active layer disposed above the substrate layer, and a second active layer disposed above the first active layer, the second active layer is proximal to the front side, and the substrate layer is proximal to the backside;
a data storage element, disposed in and surrounding the first active layer and the second active layer;
a first bit line set, including a first bit line and a first complementary bit line, wherein at least one of the first bit line and the first complementary bit line is disposed on the front side of the substrate above the second active layer; and
a second bit line set, including a second bit line and a second complementary bit line, wherein at least one of the second bit line and the second complementary bit line is disposed on the backside of the substrate below the substrate layer, wherein the first bit line set further includes a third bit line coupled to the first bit line, and the third bit line is disposed on a side of the substrate opposite to the first bit line.

2. The semiconductor structure of claim 1, wherein the data storage element is a static random-access memory (SRAM) device.

3. The semiconductor structure of claim 1, wherein the first bit line and the second bit line are disposed on the front side of the substrate above the second active layer, and the first complementary bit line and the second complementary bit line are disposed on the backside of the substrate below the substrate layer.

4. The semiconductor structure of claim 1, wherein the first bit line and the first complementary bit line are disposed on the front side of the substrate above the second active layer, and the second bit line and the second complementary bit line are disposed on the backside of the substrate below the substrate layer.

5. The semiconductor structure of claim 1, wherein the second bit line set further includes a fourth bit line coupled to the second bit line, and the fourth bit line is disposed on a side of the substrate opposite to the second bit line.

6. The semiconductor structure of claim 1, further comprising:
  a power/ground line, disposed on the backside of the substrate below the substrate layer at an elevation same as that of the at least one of the second bit line and the second complementary bit line.

7. The semiconductor structure of claim 6, wherein the first bit line and the second bit line are disposed on the backside of the substrate below the substrate layer, and the power/ground line is disposed between the first bit line and the second bit line.

8. The semiconductor structure of claim 1, wherein the data storage element includes a transistor, and the power/ground line is connected to a source of the transistor from the backside of the substrate, and the at least one of the second bit line or the second complementary bit line is connected to a drain of the transistor from the backside of the substrate.

9. The semiconductor structure of claim 1, wherein the data storage element includes a transistor having a source, a gate and a drain arranged along a first direction, and the first bit line or the first complementary bit line extends substantially along the first direction.

10. A semiconductor structure, comprising:
  a substrate, having a front side and a backside opposite to the front side, wherein the substrate includes a substrate layer, a first active layer disposed above the substrate layer, and a second active layer disposed above the first active layer, the second active layer is proximal to the front side, and the substrate layer is proximal to the backside;
  a data storage element, disposed in and surrounding the first active layer and the second active layer;
  a first word line, disposed on the backside of the substrate below the substrate layer; and
  a second word line, disposed on the front side of the substrate above the second active layer.

11. The semiconductor structure of claim 10, further comprising:
  a power/ground line, disposed on the backside of the substrate below the substrate layer, wherein the power/ground line is disposed at an elevation above an elevation of the first word line.

12. The semiconductor structure of claim 11, wherein an extending direction of the power/ground line is substantially perpendicular to an extending direction of the first word line.

13. The semiconductor structure of claim 10, further comprising:
  a third word line, disposed on the front side of the substrate at an elevation higher than an elevation of the second word line.

14. A semiconductor structure, comprising:
  a substrate, having a front side and a backside opposite to the front side, wherein the substrate includes a substrate layer proximal to the backside;
  a plurality of complementary FETs (CFETs), disposed on the substrate layer, wherein the CFETs are proximal to the front side of the substrate and collectively correspond to a data storage element;
  a first bit line set, including a first bit line and a first complementary bit line, wherein at least one of the first bit line and the first complementary bit line is disposed on the front side of the substrate above the CFETs;
  a second bit line set, including a second bit line and a second complementary bit line, wherein at least one of the second bit line and the second complementary bit line is disposed on the backside of the substrate below the substrate layer;
  a first power/ground line, disposed on the backside of the substrate below the substrate layer at an elevation same as an elevation of the at least one of the second bit line and the second complementary bit line; and
  a first word line, disposed on the front side of the substrate above the at least one of the first bit line and the first complementary bit line.

15. The semiconductor structure of claim 14, further comprising:
  a second power/ground line, disposed on the front side of the substrate above the CFETs at an elevation same as an elevation of the at least one of the first bit line and the first complementary bit line.

16. The semiconductor structure of claim 14, further comprising:
  a second word line, disposed on the backside of the substrate below the substrate layer, wherein the second word line is at an elevation below the elevation of the first power/ground line.

17. The semiconductor structure of claim 14, wherein the at least one of the second bit line and the second complementary bit line disposed on the backside of the substrate includes a first metallic material different from a second metallic material of the at least one of the first bit line and the first complementary bit line disposed on the front side of the substrate, and a resistance of the first metallic material is substantially less than a resistance of the second metallic material.

18. The semiconductor structure of claim 1, wherein a material of the first bit line set is different from a material of the second bit line set.

19. The semiconductor structure of claim 10, wherein the data storage element is a static random-access memory (SRAM) device.

20. The semiconductor structure of claim 14, wherein a material of the first bit line set is different from a material of the second bit line set.

* * * * *